(12) United States Patent
Sumitomo

(10) Patent No.: US 10,186,606 B2
(45) Date of Patent: Jan. 22, 2019

(54) SEMICONDUCTOR DEVICE

(71) Applicant: DENSO CORPORATION, Kariya, Aichi-pref. (JP)

(72) Inventor: Masakiyo Sumitomo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/537,644

(22) PCT Filed: Jan. 13, 2016

(86) PCT No.: PCT/JP2016/000134
§ 371 (c)(1),
(2) Date: Jun. 19, 2017

(87) PCT Pub. No.: WO2016/114131
PCT Pub. Date: Jul. 21, 2016

(65) Prior Publication Data
US 2017/0352747 A1 Dec. 7, 2017

(30) Foreign Application Priority Data

Jan. 16, 2015 (JP) .................................. 2015-007006
Dec. 24, 2015 (JP) .................................. 2015-252136

(51) Int. Cl.
*H01L 29/739* (2006.01)
*H01L 27/07* (2006.01)
(Continued)

(52) U.S. Cl.
CPC .......... *H01L 29/739* (2013.01); *H01L 21/761* (2013.01); *H01L 27/04* (2013.01);
(Continued)

(58) Field of Classification Search
CPC ............... H01L 29/739; H01L 27/0761; H01L 27/0716; H01L 27/0727; H01L 27/0629;
(Continued)

(56) References Cited

U.S. PATENT DOCUMENTS

2012/0126284 A1* 5/2012 Matsuda ............. H01L 29/0619
257/139
2013/0001639 A1 1/2013 Iwasaki et al.
(Continued)

FOREIGN PATENT DOCUMENTS

JP     H11-345969 A    12/1999
JP     2001-308328   * 11/2001 ............. H01L 29/78
(Continued)

OTHER PUBLICATIONS

Machine translation, Kawaji, Japanese Pat. Pub. No. JP 2001-308328, translation date: Apr. 27, 2018, Espacenet, all pages.*
(Continued)

Primary Examiner — Victoria K Hall
(74) Attorney, Agent, or Firm — Posz Law Group, PLC

(57) ABSTRACT

A semiconductor device includes: a semiconductor substrate having a drift layer; a base layer on the drift layer; a collector layer and a cathode layer arranged on the drift layer opposite to the base layer; multiple trenches penetrating the base layer and reaching the drift layer, and arranged along one direction; a gate electrode arranged in each trench via a gate insulating film; and an emitter region arranged in a surface portion of the base layer, and contacting with each trench. The semiconductor substrate includes an IGBT region having the emitter region and an FWD region in which an injection limiting region and a contact region are arranged in the surface portion of the base layer alternately along the one direction.

8 Claims, 10 Drawing Sheets

(51) Int. Cl.
*H01L 21/761* (2006.01)
*H01L 27/04* (2006.01)
*H01L 29/08* (2006.01)
*H01L 29/417* (2006.01)
*H01L 29/66* (2006.01)
*H01L 29/78* (2006.01)
*H01L 29/10* (2006.01)
*H01L 29/06* (2006.01)

(52) U.S. Cl.
CPC ...... *H01L 27/0716* (2013.01); *H01L 27/0727* (2013.01); *H01L 27/0761* (2013.01); *H01L 29/0619* (2013.01); *H01L 29/0696* (2013.01); *H01L 29/0821* (2013.01); *H01L 29/1095* (2013.01); *H01L 29/41708* (2013.01); *H01L 29/66325* (2013.01); *H01L 29/7397* (2013.01); *H01L 29/78* (2013.01); *H01L 29/0692* (2013.01); *H01L 29/0834* (2013.01)

(58) Field of Classification Search
CPC .......... H01L 27/102; H01L 27/1021; H01L 27/1022
See application file for complete search history.

(56) References Cited

U.S. PATENT DOCUMENTS

| | | | | |
|---|---|---|---|---|
| 2013/0087829 A1* | 4/2013 | Tanabe | ............. | H01L 29/66348 257/140 |
| 2013/0221401 A1* | 8/2013 | Ogura | .................... | H01L 29/36 257/139 |
| 2013/0240947 A1 | 9/2013 | Matsudai et al. | | |
| 2013/0260515 A1 | 10/2013 | Mizushima | | |
| 2014/0070270 A1* | 3/2014 | Yoshida | ............ | H01L 29/66128 257/140 |
| 2014/0361333 A1 | 12/2014 | Kimura et al. | | |
| 2016/0035869 A1 | 2/2016 | Matsudai et al. | | |
| 2016/0043073 A1* | 2/2016 | Tamura | ............... | H01L 27/0664 257/140 |
| 2016/0148928 A1* | 5/2016 | Soneda | ............... | H01L 27/0727 257/77 |
| 2016/0254264 A1 | 9/2016 | Mizushima | | |
| 2016/0268252 A1* | 9/2016 | Saito | ................... | H01L 27/0629 |
| 2018/0204909 A1* | 7/2018 | Konishi | ................ | H01L 29/739 |

FOREIGN PATENT DOCUMENTS

| | | |
|---|---|---|
| JP | 2001-308328 A | 11/2001 |
| JP | 2011-165971 A | 8/2011 |
| JP | 2013-021142 A | 1/2013 |

OTHER PUBLICATIONS

Machine translation, Ogura, Japanese Pat. Pub. No. JP H11-345969, translation date: Apr. 26, 2018, Espacenet, all pages.*

Machine translation, Sugiyama, Japanese Pat. Pub. No. JP 2011-165971, translation date: Apr. 26, 2018, Espacenet, all pages.*

ISA/JP, English translation of the Written Opinion of the International Searching Authority, PCT App. No. PCT/JP2016/000134, World Intellectual Property Office (WIPO), dated Jul. 18, 2017, all pages.*

* cited by examiner

SEMICONDUCTOR DEVICE

CROSS REFERENCE TO RELATED APPLICATIONS

This application is a U.S. national stage application of International Patent Application No. PCT/JP2016/000134 filed on Jan. 13, 2016 and is based on Japanese Patent Applications No. 2015-7006 filed on Jan. 16, 2015, and No. 2015-252136 filed on Dec. 24, 2015, the disclosures of which are incorporated herein by reference.

TECHNICAL FIELD

The present disclosure relates to a semiconductor device including an insulated gate bipolar transistor element (hereinafter, referred to as an IGBT element for short) having an insulated gate structure and a free wheel diode element (hereinafter, referred to as an FWD element for short) provided to a common semiconductor substrate.

BACKGROUND ART

A semiconductor device in the related art proposed as, for example, a switching element used in an inverter has an IGBT region where an IGBT element is provided and an FWD region where an FWD element is provided (see, for example, Patent Literature 1).

More specifically, the proposed semiconductor device includes a base layer in a surface-layer portion of a semiconductor substrate forming an N⁻-type drift layer, and multiple trenches provided to penetrate through the base layer. Each trench is provided with a gate insulating film to cover a wall surface and a gate electrode is provided on the gate insulating film.

A P-type collector layer and an N-type cathode layer are provided on a back surface side of the semiconductor substrate. An N⁺-type emitter region is provided to the base layer in a portion located above the collector layer. An upper electrode to be electrically connected to the base layer and the emitter region is provided on a surface side of the semiconductor substrate, and a lower electrode to be electrically connected to the collector layer and the cathode layer is provided on the back surface side of the semiconductor substrate. A region where the collector layer is provided and a region where the cathode layer is provided on the back surface side of the semiconductor substrate are referred to as an IGBT region and an FWD region, respectively. When configured as above, the N-type cathode layer and drift layer and the P-type base layer form an FWD element having an PN-junction in the FWD region of the semiconductor substrate.

In the semiconductor device configured as above, when a voltage lower than a voltage applied to the lower electrode is applied to the upper electrode and a turn-on voltage is applied to the gate electrode, an N-type inversion layer (that is, a channel) is formed in the base layer in a portion in contact with the trenches. Hence, electrons are supplied to the drift layer from the emitter region via the inversion layer and holes are supplied to the drift layer from the collector layer. Eventually, a resistance value of the drift layer decreases due to conductivity modulation. The IGBT element thus switches ON. The turn-on voltage referred to herein means a voltage which raises a gate-emitter voltage Vge above a threshold voltage Vth of an insulated gate structure.

The FWD element switches ON when a voltage higher than a voltage applied to the lower electrode is applied to the upper electrode and a voltage between the upper electrode and the lower electrode rises above a forward voltage. Holes are thus injected into the drift layer from the base layer.

In the semiconductor device configured as above, however, the base layer is common between the IGBT region and the FWD region. Hence, an impurity concentration of the base layer in the FWD region (that is, an anode layer) becomes too high. In such a case, when the FWD element switches ON (performs a diode operation), too many holes are injected, which results in a problem that a reverse recovery charge becomes so high that a recovery current is increased.

PATENT LITERATURE

Patent Literature 1: JP-2013-152996-A

SUMMARY

It is an object of the present disclosure to provide a semiconductor device having an IGBT region and an FWD region and capable of reducing a recovery current.

According to an aspect of the present disclosure, a semiconductor device includes: a semiconductor substrate having a drift layer of a first conduction type; a base layer of a second conduction type arranged on the drift layer; a collector layer of the second conduction type and a cathode layer of the first conduction type arranged on the drift layer opposite to the base layer; a plurality of trenches penetrating the base layer and reaching the drift layer, and arranged along one direction of plane directions of the semiconductor substrate; a gate insulating film arranged on a sidewall of each trench; a gate electrode arranged on the gate insulating film; and an emitter region of the first conduction type arranged in a surface portion of the base layer, and contacting with each trench. A region of the semiconductor substrate functioning as an IGBT element is defined as an IGBT region. A region of the semiconductor substrate functioning as an FWD element is defined as an FWD region. The emitter region is arranged in the IGBT region. In the surface portion of the base layer in the FWD region, an injection limiting region of the first conduction type having an impurity concentration higher than the drift layer and a contact region of the second conduction type having an impurity concentration higher than the base layer are arranged alternately along the one direction.

According to the semiconductor device configured as above, injection of carriers can be limited by the injection limiting region while the FWD element is performing a diode operation even when the base layer is common between the IGBT region and the FWD region. Hence, a recovery current can be reduced. Also, because the injection limiting region and the contact region are provided alternately in repetition along an extending direction of the trenches, a recovery current can be reduced without requiring alignment at a high degree of accuracy.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
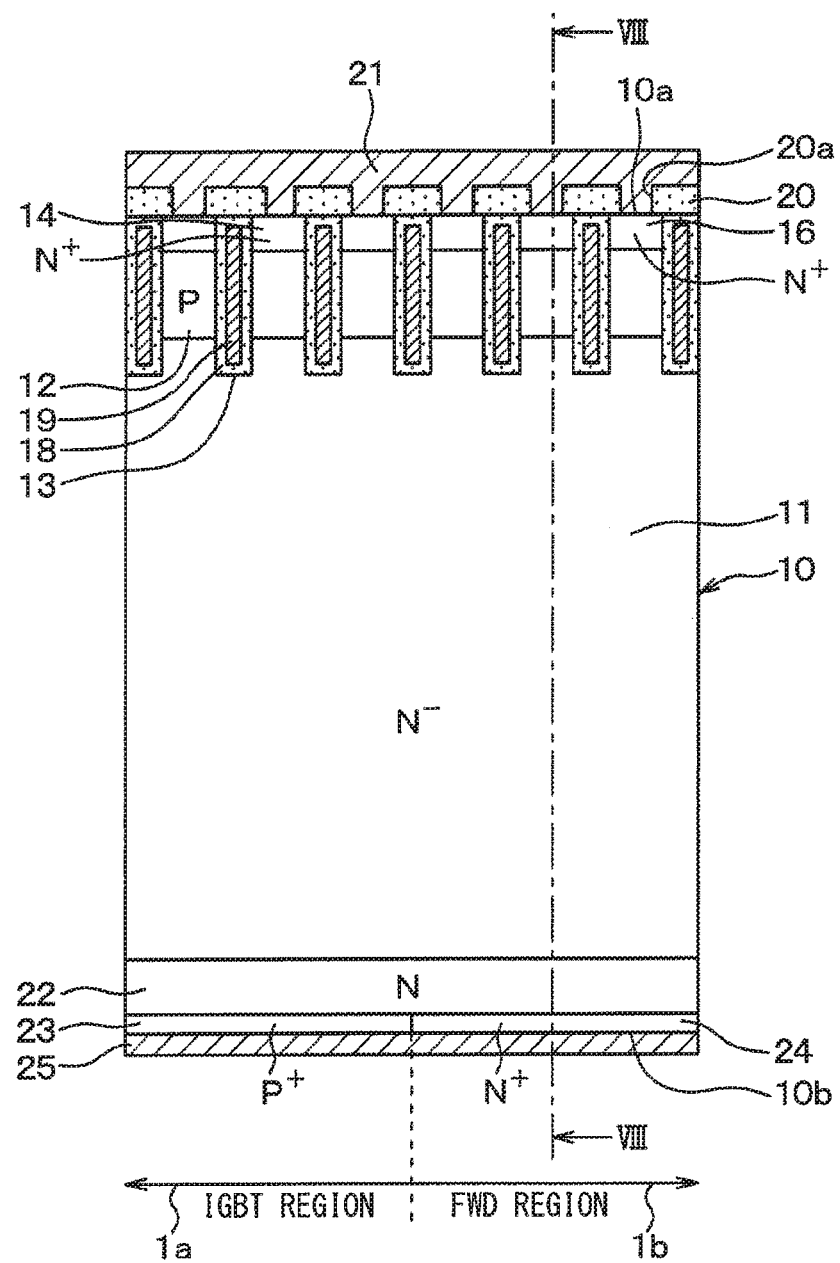
FIG. 1 is a sectional view of a semiconductor device according to a first embodiment of the present disclosure.

Hereinafter, embodiments of the present disclosure will be described according to the drawings. A description will be given by labelling same or equivalent portions with same reference numerals in respective embodiments below.

First Embodiment

A first embodiment of the present disclosure will be described. A semiconductor device of the present embodiment is suitable to a power switching element used in a power-supply circuit in an inverter, a DC-to-DC converter, or the like.

Figure 2:
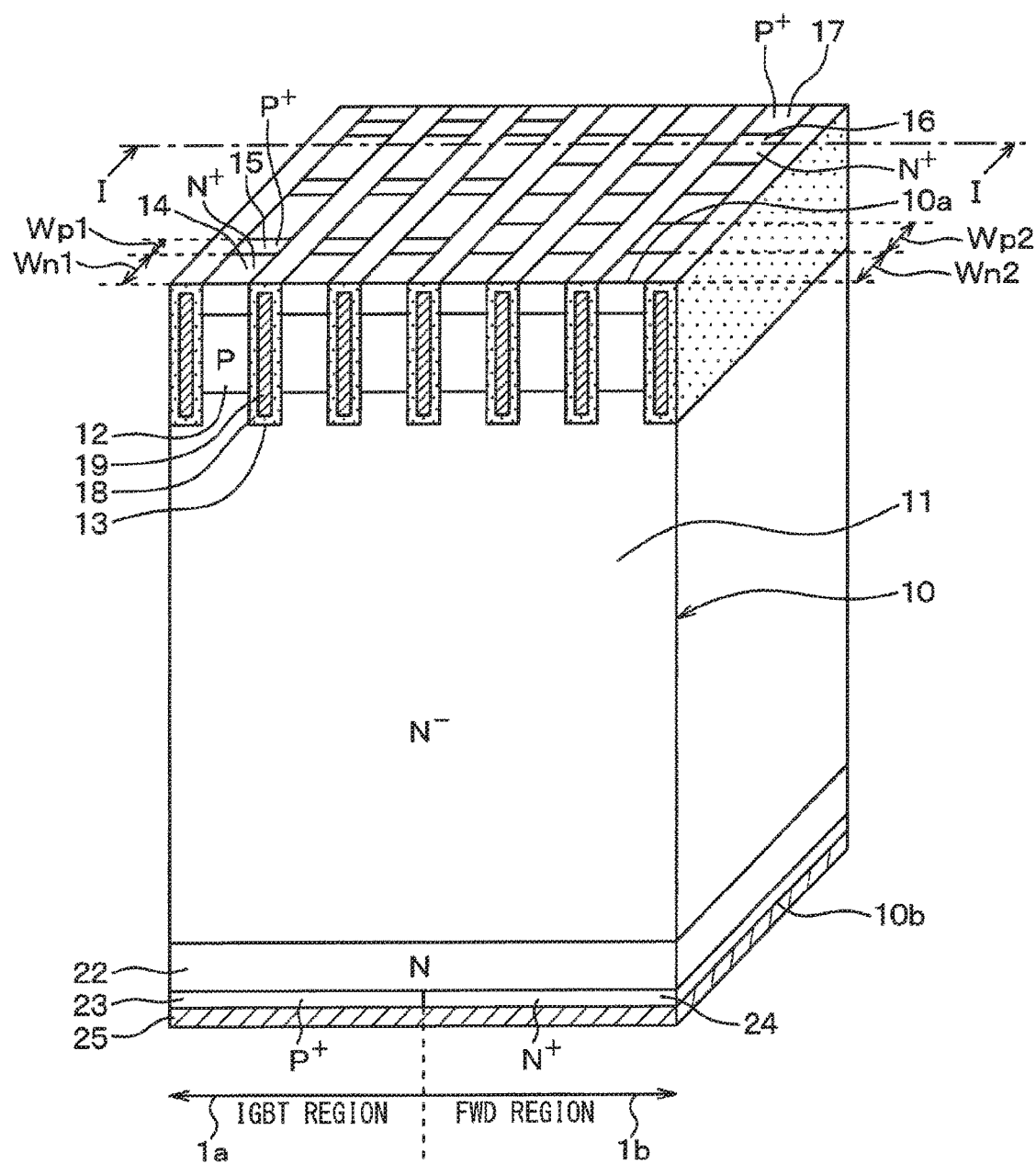
FIG. 2 is a perspective sectional view of the semiconductor device shown in FIG. 1.

As are shown in FIG. 1 and FIG. 2, the semiconductor device has an IGBT area 1a where an IGBT element is provided and an FWD region 1b where an FWD element is provided. Only one IGBT region 1a and one FWD region 1b are shown in FIG. 1. It should be appreciated, however, that the IGBT region 1a and the FWD region 1b may be provided alternately in repetition.

The IGBT region 1a and the FWD region 1b are provided to a common $N^-$-type semiconductor substrate 10 having a drift layer 11. A P-type base layer 12 is provided on the drift layer 11 (that is, on a side of one surface 10a of the semiconductor substrate 10). The base layer 12 is formed by, for example, implanting P-type impurity ions into the semiconductor substrate 10 from the side of the one surface 10a, followed by heating. An impurity concentration of the base layer 12 is same in the IGBT region 1a and the FWD region 1b.

Multiple trenches 13 are provided to reach the drift layer 11 by penetrating through the base layer 12 and the base layer 12 is divided to multiple segments by the trenches 13. The multiple trenches 13 are provided in both of the IGBT region 1a and the FWD region 1b at regular intervals along one direction of plane directions of the one surface 10a of the semiconductor substrate 10 (that is, a direction perpendicular to a sheet surface of FIG. 1).

In the IGBT region 1a, an $N^+$-type emitter region 14 having a higher impurity concentration than the drift layer 11 and a $P^+$-type contact region 15 having a higher impurity concentration than the base layer 12 are provided to a surface-layer portion of the base layer 12. In the FWD region 1b, an $N^+$-type injection limiting region 16 having a higher impurity concentration than the drift layer 11 and a $P^+$-type contact region 17 having a higher impurity concentration than the base layer 12 are provided to the surface-layer portion of the base layer 12.

The emitter region 14 and the contact region 15 are provided alternately in repetition in the IGBT region 1a and the injection limiting region 16 and the contact region 17 are provided alternately in repetition in the FWD region 1b along an extending direction of the trenches 13. The emitter regions 14 provided in the IGBT region 1a and the injection limiting regions 16 provided in the FWD region 1b have a same impurity concentration. The contact regions 15 and 17 provided, respectively, in the IGBT region 1a and the FWD region 1b have a same impurity concentration.

The emitter regions 14 and the injection limiting regions 16 are formed at a same time by, for example, placing a mask opening at predetermined locations on the one surface 10a of the semiconductor substrate 10 and implanting same N-type impurity ions into the semiconductor substrate 10 from the side of the one surface 10a at regions where the emitter regions 14 are to be formed and regions where the injection limiting regions 16 are to be formed, followed by heating. Likewise, the contact regions 15 and 17 are formed at a same time by, for example, placing a mask opening at predetermined locations on the one surface 10a of the semiconductor substrate 10 and implanting same P-type impurity ions into the semiconductor substrate 10 from the side of the one surface 10a at regions where the contact regions 15 and 17 are to be formed, followed by heating.

Hence, by changing a shape of the masks as needed, a ratio of a length of the emitter region 14 in a direction along the extending direction of the trenches 13 (hereinafter, referred to simply as a length of the emitter region 14) Wn1 and a length of the contact region 15 in a direction along the extending direction of the trenches 13 (hereinafter, referred to simply as a length of the contact region 15) Wp1 in the IGBT region 1a can be changed as needed. Likewise, a ratio of a length of the injection limiting region 16 in a direction along the extending direction of the trenches 13 (hereinafter, referred to simply as a length of the injection limiting region 16) Wn2 and a length of the contact region 17 in a direction along the extending direction of the trenches 13 (hereinafter, referred to simply as a length of the contact region 17) Wp2 in the FWD region 1b can be changed as needed.

In the present embodiment, a ratio of the length Wn1 of the emitter region 14 and the length Wp1 of the contact region 15 and a ratio of the length Wn2 of the injection limiting region 16 and the length Wp2 of the contact region 17 are made different. More specifically, the length Wn1 of the emitter region 14 is made longer than the length Wp1 of the contact region 15 whereas the length Wn2 of the injection limiting region 16 and the length Wp2 of the contact region 17 are made equal.

The trenches 13 are filled with a gate insulating film 18 provided to cover a wall surface of the respective trenches 13 and gate electrodes 19 made of polysilicon or the like and provided on the gate insulating film 18. A trench gate structure is thus formed.

An interlayer insulating film 20 made of BPSG or the like is provided on the one surface 10a of the semiconductor substrate 10. An upper electrode 21 is provided on top of the interlayer insulating film 20 to be electrically connected to the emitter regions 14, the contact regions 15 and 17, and the injection limiting regions 16 via contact holes 20a provided to the interlayer insulating film 20. That is, the upper electrode 21 functioning as an emitter electrode in the IGBT region 1a and functioning as an anode electrode in the FWD region 1b is provided on top of the interlayer insulating film 20. The interlayer insulating film 20 and the upper electrode 21 are not shown in FIG. 2 to make a relation among the emitter regions 14, the contract regions 15, the injection limiting regions 16, and the contact regions 17 easy to understand.

An N-type field stopping layer (hereinafter, referred to as the FS layer for short) 22 is provided to the drift layer 11 on an opposite side to the base layer 12 (that is, on a side of the other surface 10b of the semiconductor substrate 10). The FS layer 22 is not essentially necessary. However, the FS layer 22 is provided herein to prevent a depletion layer from widening with the aim of enhancing performance regarding a breakdown voltage and a steady loss and controlling an amount of holes injected from the side of the other surface 10b of the semiconductor substrate 10.

A P-type collector layer 23 is provided in the IGBT region 1a on the opposite side to the drift layer 11 with the FS layer 22 in between and an N-type cathode layer 24 is provided in the FWD region 1b on the opposite side to the drift layer 11 with the FS layer 22 in between. That is, the IGBT region 1a and the FWD region 1b are divided depending on whether the layer provided on the side of the other surface 10b of the substrate 10 is the collector layer 23 or the cathode layer 24. In short, in the present embodiment, a portion above the collector layer 23 is the IGBT region 1a and a portion above the cathode layer 24 is the FWD region 1b.

A lower electrode 25 is provided on top of the collector layer 23 and the cathode layer 24 (that is, on the other surface 10b of the semiconductor substrate 10). In other words, the lower electrode 25 functioning as a collector electrode in the IGBT region 1a and functioning as a cathode electrode in the FWD region 1b is provided.

Owing to the configuration as above, an FWD element, in which a PN-junction is formed between an anode made up of the base layer 12 and the contact region 17 and a cathode made up of the drift layer 11, the FS layer 22, and the cathode layer 24, is formed in the FWD region 1b.

The above has described a fundamental configuration of the semiconductor device of the present embodiment. In the present embodiment, an N$^+$-type and an N$^-$-type correspond to a first conduction type of the present disclosure and a P-type and a P$^+$-type correspond to a second conduction type of the present disclosure. The following will describe an operation of the semiconductor device.

Firstly, the PN-junction formed between the base layer 12 and the drift layer 11 comes into a reverse conducting state when the upper electrode 21 is grounded and a positive voltage is applied to the lower electrode 25. Hence, when a voltage at a low level (for example, 0 V) is applied to the gate electrodes 19, a depletion layer is formed at the PN-junction and no current flows between the upper electrode 21 and the lower electrode 25.

In order to switch ON the IGBT element, a voltage as high as or higher than a threshold voltage Vth of an insulated gate structure is applied to the gate electrodes 19 while the upper electrode 21 is grounded and a positive voltage is applied to the lower electrode 25. An inversion layer is thus formed in the base layer 12 in portions in contact with the trenches 13 in which the gate electrodes 19 are disposed. Accordingly, electrons are supplied to the drift layer 11 from the emitter regions 14 via the inversion layer and holes are supplied to the drift layer 11 from the collector layer 23. Hence, a resistance value of the drift layer 11 decreases due to conductivity modulation. Consequently, the IGBT element switches ON.

In order to make the FWD element perform a diode operation (that is, switch ON) by switching OFF the IGBT element, a positive voltage is applied to the upper electrode 21 and the lower electrode 25 is grounded by switching voltages presently applied to the upper electrode 21 and the lower electrode 25. Subsequently, a voltage at a low level (for example, 0 V) is applied to the gate electrodes 19. Hence, the inversion layer is no longer formed in the base layer 12 in portions in contact with the trenches 13. Consequently, the FWD element performs a diode operation.

Figure 3:
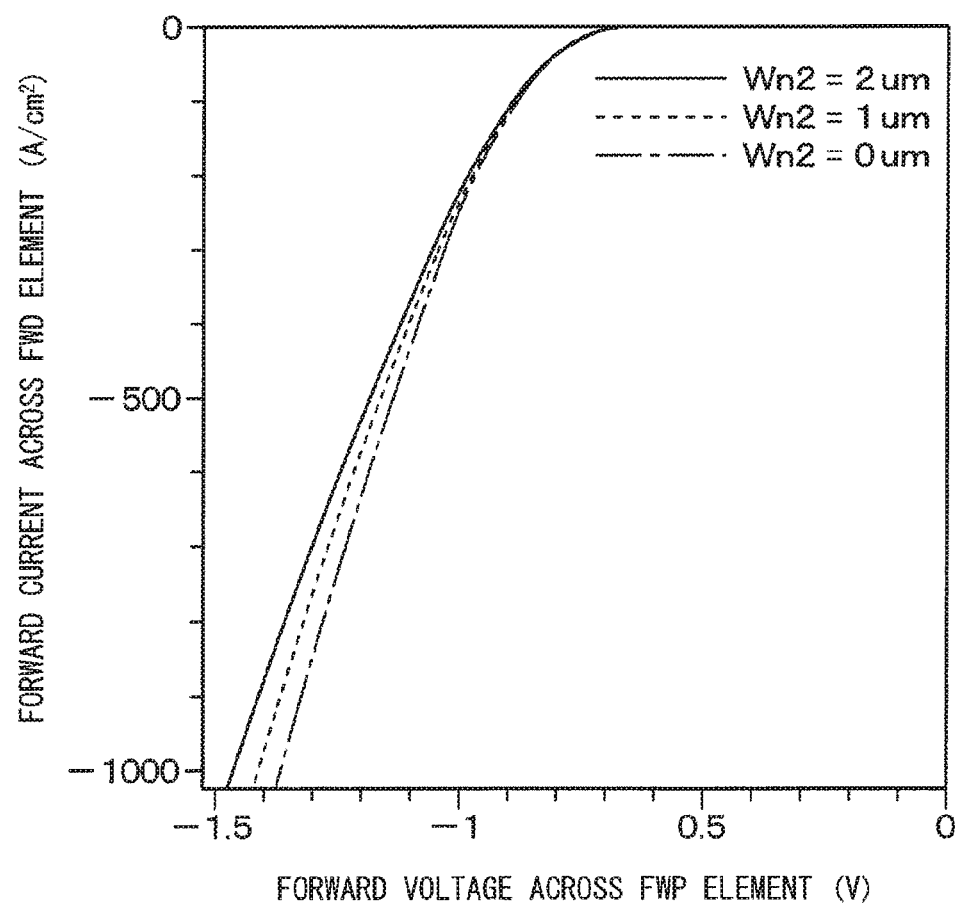
FIG. 3 is a view showing a simulation result representing a relation of a forward voltage and a forward current across an FWD element.

Meanwhile, the injection limiting regions 16 are provided to the surface-layer portion of the base layer 12 in the FWD region 1b. Hence, because the base layer 12 is common between the IGBT region 1a and the FWD region 1b, an impurity concentration is high for the FWD element. However, injection of holes is limited by the injection limiting regions 16. A resistance component in the base layer 12 is thus increased and a forward voltage across the FWD element rises, too. More specifically, as is shown in FIG. 3, fewer holes are injected and a forward voltage rises higher as the length Wn2 of the injection limiting region 16 becomes longer. In other words, a forward voltage rises higher as the injection limiting regions 16 account for a larger percentage of the surface-layer portion of the base layer 12.

In order to cut off a current while the FWD element is performing a diode operation, reverse voltages are applied by applying a negative voltage to the upper electrode 21 and applying a positive voltage to the lower electrode 25. Consequently, a current is cut off after the FWD element switches to a recovery state.

Figure 4:
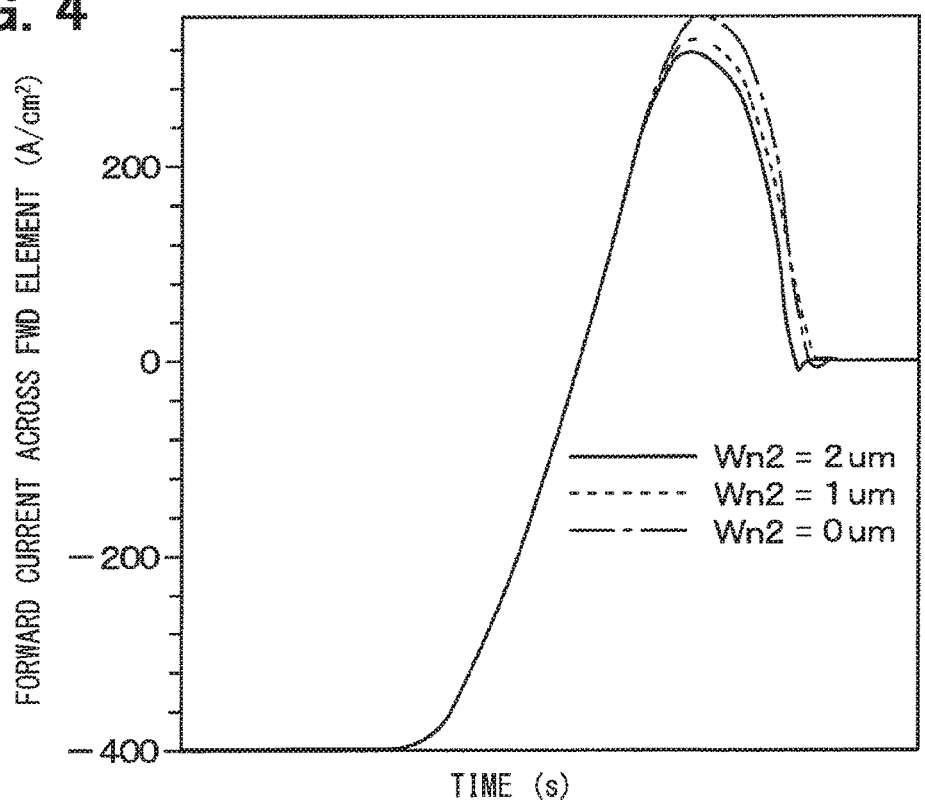
FIG. 4 is a view showing a simulation result representing a relation of a time and a forward current across the FWD element.

A reverse recovery charge is generated in the recovery state. However, excessive carriers in the drift layer 11 are reduced in advance by the injection limiting regions 16. Hence, the reverse recovery charge is reduced to a sufficiently small value and a recovery current can be reduced. More specifically, as is shown in FIG. 4, a recovery current can be reduced more as the length Wn2 of the injection limiting region 16 becomes longer. In other words, a recovery current can be reduced more as the injection limiting regions 16 account for a larger percentage of the surface-layer portion of the base layer 12.

Figure 5:
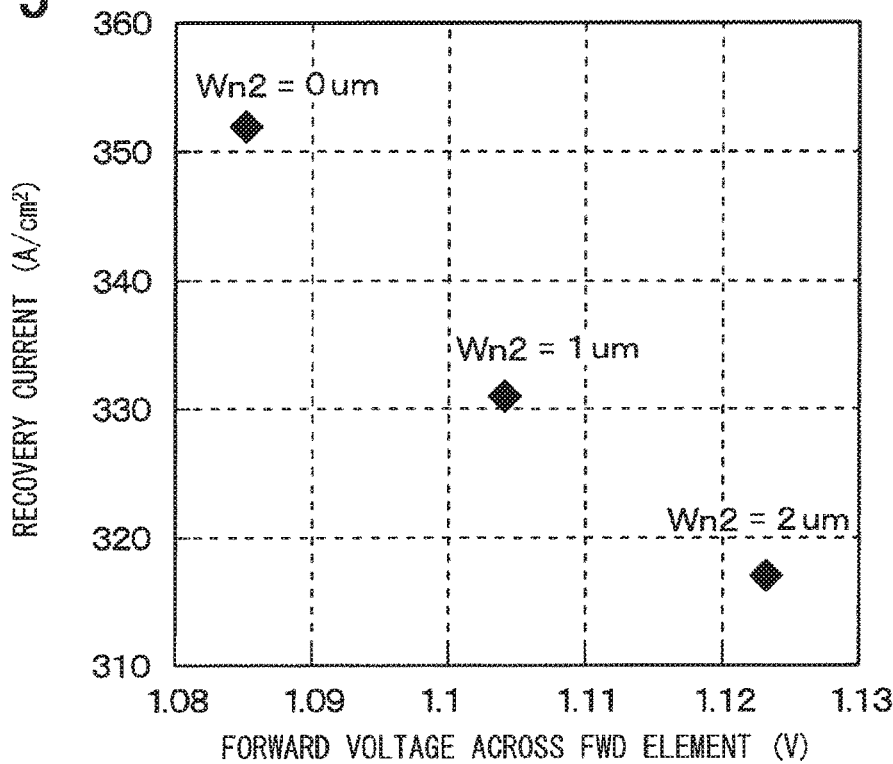
FIG. 5 is a view showing a simulation result representing a relation of a forward voltage and a forward current across the FWD element.

That is, as is shown in FIG. 5, a forward voltage across the FWD element rises higher and a recovery current can be reduced more as the length Wn2 of the injection limiting region 16 becomes longer. As has been described above, a ratio of the length Wn2 of the injection limiting region 16 and the length Wp2 of the contract region 17 can be changed as needed. It is therefore preferable to change the respective lengths Wn2 and Wp2 to suit usage.

In the present embodiment, as has been described, the injection limiting regions 16 are provided to the surface-layer portion of the base layer 12 in the FWD region 1b. Hence, even when the base layer 12 is common between the IGBT region 1a and the FWD region 1b, injection of carriers is limited by the injection limiting regions 16. Consequently, a recovery current can be reduced.

The trenches 13 made finer by reducing an interval between adjacent trenches 13 to about 1 μm are more desirable in recent years. In such a case, alignment at a high degree of accuracy is required to provide the injection limiting regions 16 and the contact regions 17 along a direction in which the adjacent trenches 13 are aligned (that is, a right-left direction on sheet surfaces of FIG. 1 and FIG. 2). To overcome such a difficulty, the injection limiting region 16 and the contact region 17 are provided alternately in repetition along the extending direction of the trenches 13 in the present embodiment. Hence, a recovery current can be reduced without requiring alignment at a high degree of accuracy. In short, a recovery current can be reduced without having to make a manufacturing process complex.

Second Embodiment

A second embodiment of the present disclosure will be described. The present embodiment is same as the first embodiment above except that a body region is provided. A description of a configuration same as the configuration of the first embodiment above is omitted herein.

Figure 6:
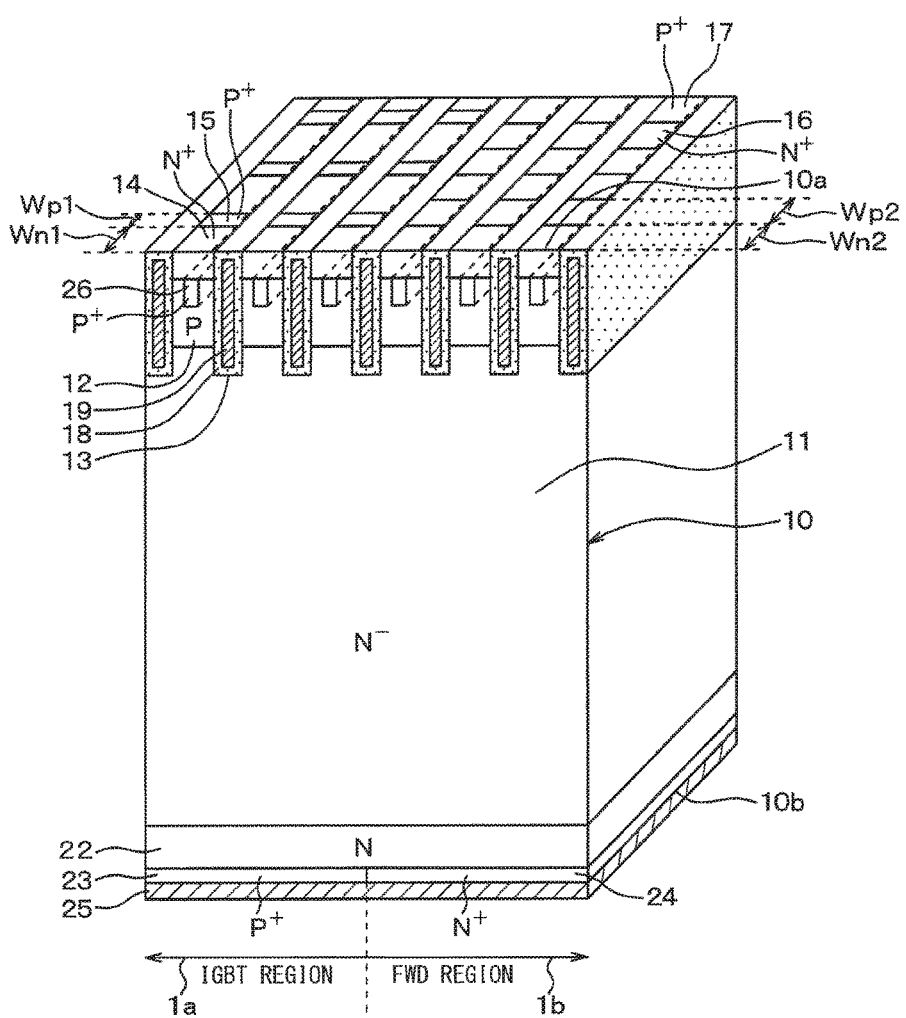
FIG. 6 is a perspective sectional view of a semiconductor device according to a second embodiment of the present disclosure.

As is shown in FIG. 6, in the present embodiment, a body region 26 is provided beneath an emitter region 14 and a contact region 15 and beneath an injection limiting region 16 and a contact region 17 in a base layer 12. More specifically, the body region 26 has a higher impurity concentration than the base layer 12 and is shaped like a rod extended along an extending direction of trenches 13. That is, when viewed from a side of one surface 10a of a semiconductor substrate 10, the body region 26 is provided to cross the emitter region 14 and the contact region 15 as well as the injection limiting region 16 and the contact region 17. The body region 26 is spaced apart from the trenches 13 and connected to the contact regions 15 and 17.

According to the configuration as above, holes accumulated in a drift layer 11 are readily released from an upper electrode 21 via the base layer 12, the body regions 26, and the contact regions 15 and 17 when an IGBT element is switched OFF. That is, holes can be restricted from flowing into the emitter regions 14. Consequently, an effect same as the effect of the first embodiment above can be obtained while restricting a latch-up.

Third Embodiment

A third embodiment of the present disclosure will be described. The present embodiment is same as the first embodiment above except that an outer peripheral region is provided. A description of a same configuration as the configuration of the first embodiment above is omitted herein.

Figure 7:
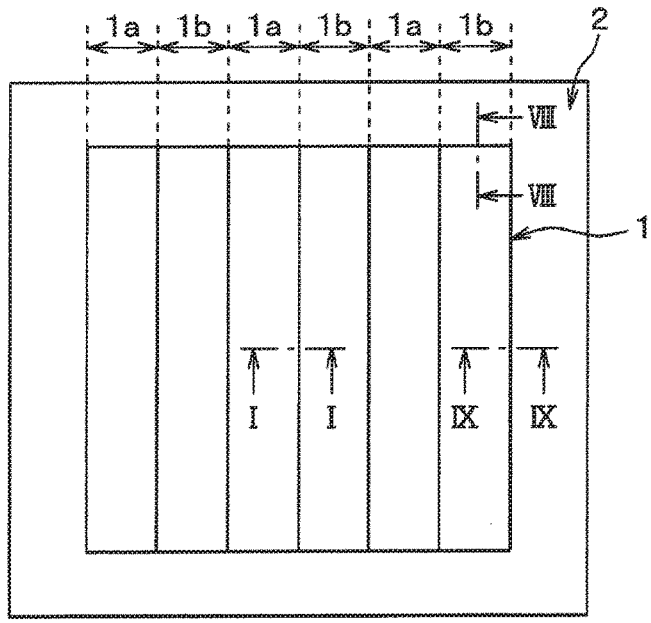
FIG. 7 is a top view of a semiconductor device according to a third embodiment of the present disclosure.

As is shown in FIG. 7, a semiconductor device of the present embodiment has a cell region 1 and an outer peripheral region 2 enclosing the cell region 1. The cell region 1 has the IGBT region 1a and the FWD region 1b described in the first embodiment above. FIG. 1 referred to in the description of the first embodiment above is a sectional view taken along the line I-I of FIG. 7 and the IGBT region 1a and the FWD region 1b are provided alternately in repetition along a direction orthogonal to an extending direction of trenches 13.

Figure 8:
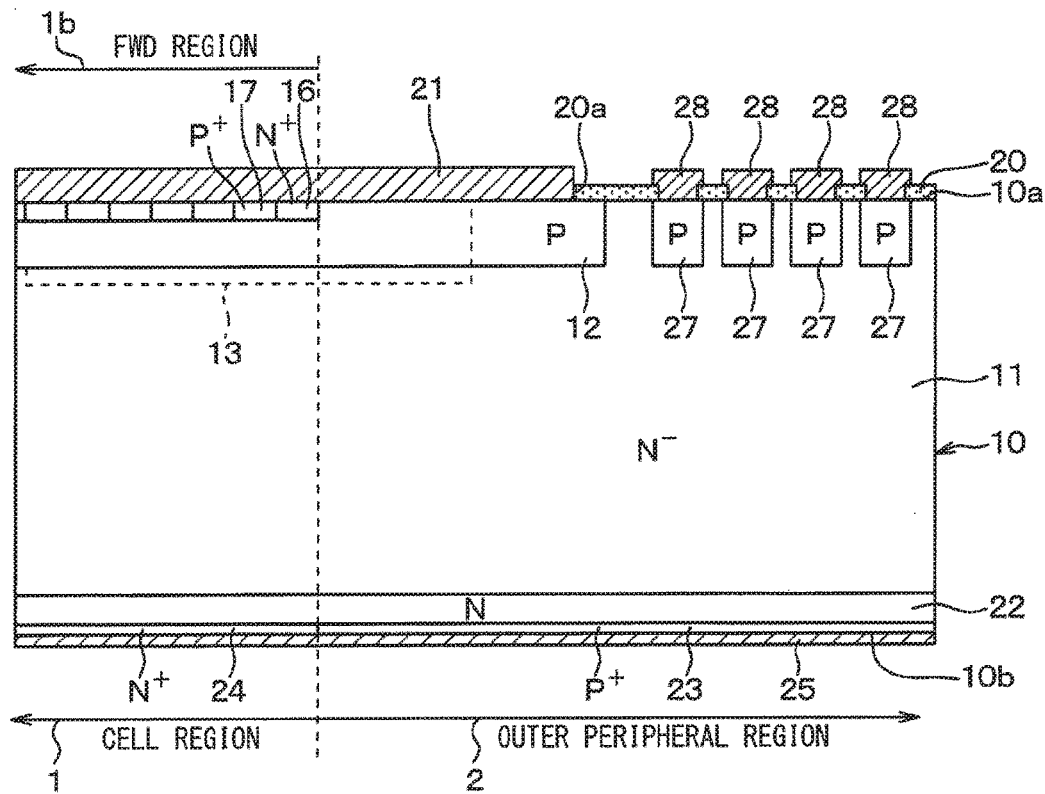
FIG. 8 is a sectional view taken along the line VIII-VIII of FIG. 7.
Figure 9:
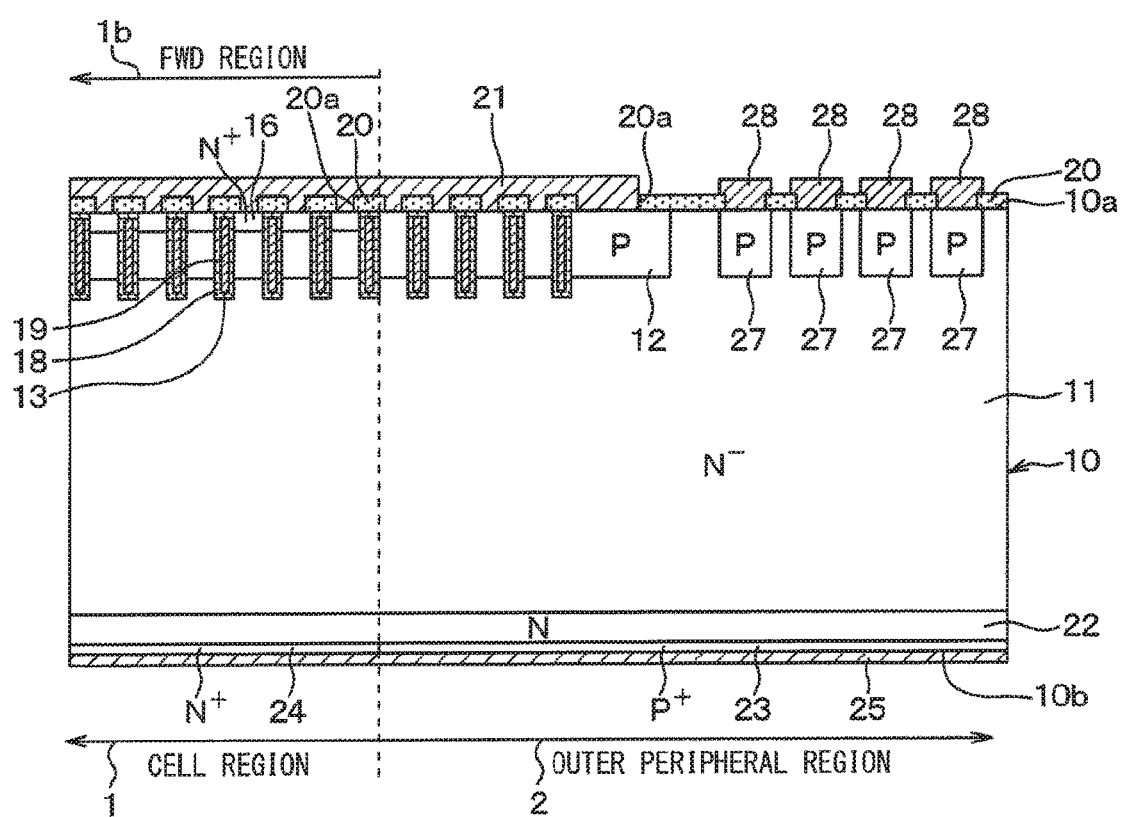
FIG. 9 is a sectional view taken along the line IX-IX of FIG. 7.

As are shown in FIG. 8 and FIG. 9, the outer peripheral portion 2 has a drift layer 11 same as a drift layer 11 of the cell region 1 and a base layer 12 is provided to the drift layer 11 in a portion on a side of an FWD region 1b to raise a breakdown voltage. In other words, the base layer 12 extended from the side of the FWD region 1b is provided to the outer peripheral portion 2 in a portion on the side of the FWD region 1b. An electric field readily concentrates at ends of trenches 13 in the extending direction. Hence, as is shown in FIG. 8, the trenches 13 are extended from the FWD region 1b to the outer peripheral region 2 for both ends to be located in the outer peripheral region 2. Likewise, among the multiple trenches 13, an electric field readily concentrates in trenches 13 located at both ends in an alignment direction of the trenches 13. Hence, as is shown in FIG. 9, trenches 13 are provided also in the outer peripheral portion 2. That is, the multiple trenches 13 include trenches 13 located in the outer peripheral region 2 at both ends in the alignment direction.

FIG. 8 corresponds to a sectional view taken along the line VIII-VIII of FIG. 1 and shows a portion between adjacent trenches 13. As are shown in FIG. 8 and FIG. 9, the trenches 13 are provided to end on an inner side in plane directions of the base layer 12 extended to the outer peripheral region 2 (that is, to the side of the FWD region 1b). Although it is not particularly shown in the drawings, the base layer 12 and the trenches 13 are provided to extend to the outer peripheral region 2 also in a boundary between an IGBT region 1a and the outer peripheral region 2 in a same manner as in a boundary between the FWD region 1b and the outer peripheral region 2.

An injection limiting region 16 is provided to the cell region 1 alone and not provided to the outer peripheral region 2. Hence, a boundary between the cell region 1 and the outer peripheral region 2 in the present embodiment can be said to be a boundary between a portion where the injection limiting region 16 is provided and a portion where the injection limiting region 16 is not provided.

A P-type guard ring layer 27 is provided to a surface-layer portion of the drift layer 11 in the outer peripheral region 2. The guard ring layer 27 is electrically disposed for independent outer peripheral electrodes 28 via contact holes 20a provided to an interlayer insulating film 20. A P$^+$-type collector layer 23 same as a P$^+$-type collector layer 23 in the IGBT region 1a is provided to the outer peripheral region 2 on a side of the other surface 10b of a semiconductor substrate 10.

The above has described a configuration of the semiconductor device of the present embodiment. The P$^+$-type collector layer 23 is provided to the outer peripheral region 2 on the side of the other surface 10b of the semiconductor substrate 10 and the base layer 12 in the outer peripheral region 2 forms a parasitic diode together with the drift layer 11 and a cathode layer 24 in the FWD region 1b, in which case the parasitic diode has an N-type layer (that is, the cathode layer 24) on the side of the other surface 10b of the semiconductor substrate 10 in the outer peripheral region 2. Hence, an internal resistance rises in comparison with a configuration in which the base layer 12 in the outer peripheral region 2 forms a parasitic diode together with the drift layer 11 and an N-type layer in the outer peripheral region 2 on the side of the other surface 10b. When the FWD element is made to perform a diode operation, injection of holes from the base layer 12 is limited in the outer peripheral region 2. Accordingly, when a current is cut off while the FWD element is performing a diode operation, a recovery current in the outer peripheral region 2 can be reduced.

In the present embodiment, the injection limiting region 16 is not provided in the outer peripheral region 2. Hence, when a current is cut off while the FWD element is performing a diode operation, an inconvenience that excessive carriers (that is, holes) in the outer peripheral region 2 flow into the injection limiting region 16 can be restricted, which can in turn prevent a malfunction of the semiconductor device.

Fourth Embodiment

A fourth embodiment of the present disclosure will be described. The present embodiment is same as the third embodiment above except that the configuration on the side of the other surface 10b of a semiconductor substrate 10 is changed. A description of a same configuration as the configuration of the third embodiment above is omitted herein.

Figure 10:
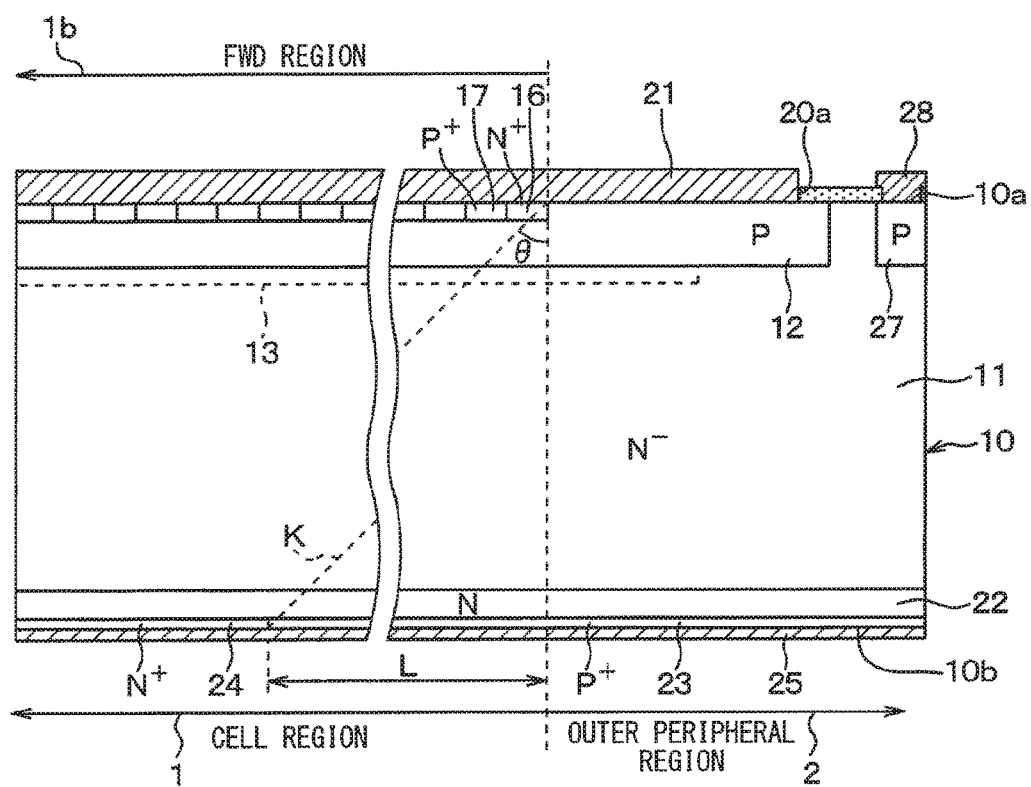
FIG. 10 is a sectional view of a semiconductor device according to a fourth embodiment of the present disclosure.

In the present embodiment, as is shown in FIG. 10, a portion of an FWD region 1b on a side of the other surface 10b of the semiconductor substrate 10 a distance L away from a boundary between an outer peripheral region 2 and the FWD region 1b (that is, an outer rim portion) is a collector layer 23. More specifically, in the present embodiment, the distance L is as long as or longer than a distance between one surface 10a and the other surface 10b of the semiconductor substrate 10 (hereinafter, referred to as a thickness of the semiconductor substrate 10).

The portion of the FWD region 1b the distance L away from the boundary between the outer peripheral region 2 and the FWD region 1b is the collector layer 23. Hence, an internal resistance of a parasitic diode formed of a base layer 12 in the outer peripheral region 2 and a cathode layer 24 in the FWD region 1b can be increased further. Accordingly, injection of holes while an FWD element is performing a diode operation can be limited further. Consequently, when a current is cut off while the FWD element is performing a diode operation, a recovery current in the outer peripheral region 2 can be reduced further.

It is known from experience that a current flowing between the one surface 10a and the other surface 10b of the semiconductor substrate 10 spreads (that is, has a distribution) at an angle of about 45°. Accordingly, in the present embodiment, a portion of the FWD region 1b on the side of the outer surface 10b of the semiconductor substrate 10 away from the boundary between the outer peripheral region 2 and the FWD region 1b by a distance equal to or greater than the thickness of the semiconductor substrate 10 is the collector layer 23. That is, a virtual line K (see FIG. 10) linking a boundary between the FWD region 1b and the outer peripheral region 2 on the one surface 10a of the semiconductor substrate 10 and a boundary between the collector layer 23 and the cathode layer 24 in the FWD region 1b and the one surface 10a of the semiconductor substrate 10 produce an angle θ of 45° or greater. Hence, a parasitic diode formed of the base layer 12 in the outer peripheral region 2 and the cathode layer 24 in the FWD region 1b is allowed to function less frequently. Consequently, a recovery current can be reduced further.

Fifth Embodiment

A fifth embodiment of the present disclosure will now be described. The present embodiment is same as the third embodiment above except that the length Wn2 of the injection limiting region 16 is changed. A description of a same configuration as the configuration of the third embodiment above is omitted herein.

Figure 11:
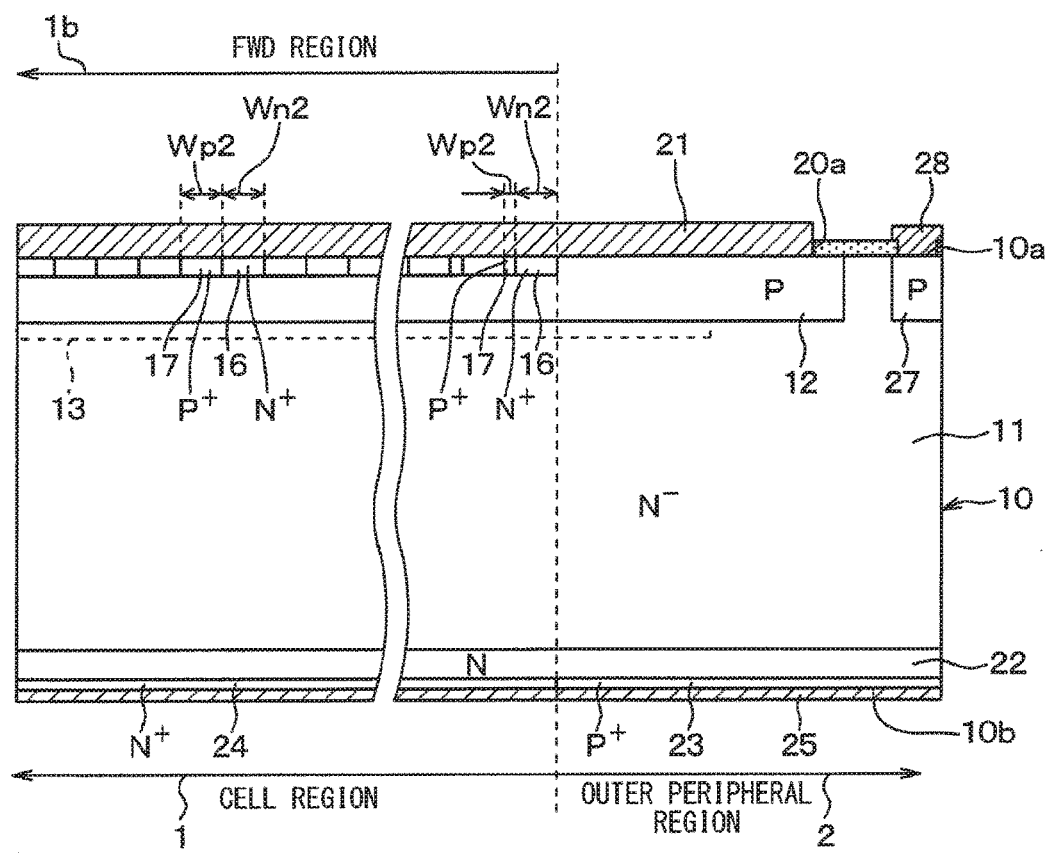
FIG. 11 is a sectional view of a semiconductor device according to a fifth embodiment of the present disclosure.

In the present embodiment, as is shown in FIG. 11, a length Wn2 of an injection limiting region 16 and a length Wp2 of a contact region 17 in an FWD region 1b differ between portions. More specifically, in a boundary portion between the FWD region 1b and an outer peripheral region 2, the injection limiting regions 16 are provided more densely than in an inner rim portion of the FWD region 1b (for example, at a center of the FWD region 1b). To be more exact, in the boundary portion between the FWD region 1b and the outer peripheral region 2, an interval between adjacent injection limiting regions 16 along an extending direction of trenches 13 is shorter than in the inner rim portion of the FWD region 1b. In the present embodiment, more specifically, the length Wp2 of the contact region 17 is shorter than the length Wn2 of the injection limiting region 16 in the boundary portion between the FWD region 1b and the outer peripheral region 2. In the present embodiment, the length Wn2 of the injection limiting region 16 and the length Wp2 of the contact region 17 are equal in the inner rim portion of the FWD region 1b as in the third embodiment above.

Hence, because the injection limiting regions 16 are provided densely in the boundary portion between the FWD region 1b and the outer peripheral region 2, injection of holes when the FWD element is made to perform a diode operation can be limited further. Consequently, when a current is cut off while the FWD element is performing a diode operation, a recovery current in the outer peripheral region 2 can be reduced further.

Modification of Fifth Embodiment

Figure 12:
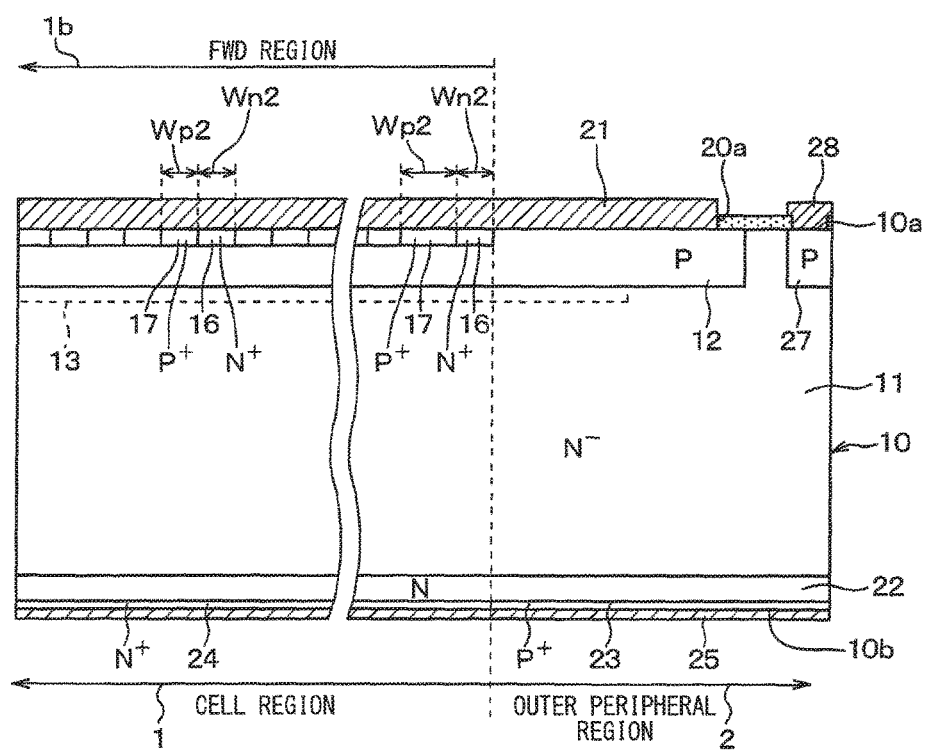
FIG. 12 is a sectional view of a semiconductor device according to a modification of the fifth embodiment of the present disclosure.

A modification of the fifth embodiment above will now be described. As is shown in FIG. 12, the configuration of the fifth embodiment above may be modified in such a manner that the injection limiting regions 16 are provided more sparsely in the boundary portion between the FWD region 1b and the outer peripheral region 2 than in the inner rim portion of the FWD region 1b. More specifically, in the boundary portion between the FWD region 1b and the outer peripheral region 2, an interval between adjacent injection limiting regions 16 in the extending direction of the trenches 13 is longer than in the inner rim portion of the FWD region 1b. To be more exact, in the boundary portion between the FWD region 1b and the outer peripheral region 2, the length Wp2 of the contact region 17 may be longer than the length Wn2 of the injection limiting region 16. Consequently, more holes are injected when the FWD element is made to perform a diode operation than in the semiconductor device described above with reference to FIG. 11 and characteristics of the FWD element can be enhanced.

Other Modifications

The embodiments above have described cases where the first conduction type is the N-type and the second conduction type is the P-type. It should be appreciated, however, that the first conduction type may be the P-type and the second conduction type may be the N-type.

The embodiments above have described that a ratio of the length Wn1 of the emitter region 14 and the length Wp1 of the contact region 15 in the IGBT region 1a and a ratio of the length Wn2 of the injection limiting region 16 and the length Wp2 of the contact region 17 in the FWD region 1b are different. It should be appreciated, however, that a ratio of the length Wn1 of the emitter region 14 and the length Wp1 of the contact region 15 in the IGBT region 1a and a ratio of the length Wn2 of the injection limiting region 16 and the length Wp2 of the contact region 17 in the FWD region 1b may be same.

In the third embodiment above, the injection limiting regions 16 may be provided to the base layer 12 in the outer peripheral region 2. In the semiconductor device modified in such a manner, injection of holes can be limited further by the injection limiting regions 16 when the FWD element performs a diode operation.

In the fourth embodiment above, the distance L may be shorter than the distance between the one surface 10a and the other surface 10b of the semiconductor substrate 10 (hereinafter, referred to as a thickness of the semiconductor substrate 10). Even in the semiconductor device modified in such a manner, the parasitic diode formed of the base layer 12 in the outer peripheral region 2 and the cathode layer 24 in the FWD region 1b is allowed to function less frequently owing to the presence of the collector layer 23 in an outer rim portion of the FWD region 1b.

In the third embodiment above, the FWD region 1b may be provided so as to enclose the IGBT region 1a. That is, the FWD region 1b may be provided all along a boundary between the cell region 1 and the outer peripheral region 2.

The semiconductor devices of the respective embodiments above may be combined. For example, the second embodiment may be combined with any one of the third through fifth embodiments to include the body region 26. The fourth embodiment may be combined with the fifth embodiment to have the collector layer 23 in the outer rim portion of the FWD region 1b. One combination may be combined with another combination of other embodiments.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
   a semiconductor substrate having a drift layer of a first conduction type;
   a base layer of a second conduction type arranged on the drift layer;
   a collector layer of the second conduction type and a cathode layer of the first conduction type arranged on the drift layer opposite to the base layer;
   a plurality of trenches penetrating the base layer and reaching the drift layer, and extending along one direction of plane directions of the semiconductor substrate;
   a gate insulating film arranged on a sidewall of each trench;
   a gate electrode arranged on the gate insulating film; and
   an emitter region of the first conduction type arranged in a surface portion of the base layer, and contacting with each trench, wherein:
   a region of the semiconductor substrate functioning as an IGBT element is defined as an IGBT region;
   a region of the semiconductor substrate functioning as an FWD element is defined as an FWD region;
   the emitter region is arranged in the IGBT region;
   in the surface portion of the base layer in the FWD region, an injection limiting region of the first conduction type having an impurity concentration higher than the drift layer and a contact region of the second conduction type having an impurity concentration higher than the base layer are arranged alternately along the one direction;
   in the surface portion of the base layer in the IGBT region, another contact region of the second conduction type is arranged together with the emitter region;
   the another contact region and the emitter region are arranged alternately along the one direction;
   a ratio between a length of the emitter region in the IGBT region along the one direction and a length of the another contact region in the IGBT region along the one direction is defined as a first ratio;
   a ratio between a length of the injection limiting region in the FWD region along the one direction and a length of the contact region in the FWD region along the one direction is defined as a second ratio; and
   the first ratio is different from the second ratio.

2. The semiconductor device according to claim 1, wherein:
   a body region is arranged in the base layer under the emitter region, the contact region, and the injection limiting region; and
   the body region has an impurity concentration higher than the base layer, extends along the one direction, contacts with the contact region, and is spaced apart from each trench.

3. A semiconductor device comprising:
   a semiconductor substrate having a drift layer of a first conduction type;
   a base layer of a second conduction type arranged on the drift layer;
   a collector layer of the second conduction type and a cathode layer of the first conduction type arranged on the drift layer opposite to the base layer;
   a plurality of trenches penetrating the base layer and reaching the drift layer, and extending along one direction of plane directions of the semiconductor substrate;
   a gate insulating film arranged on a sidewall of each trench;
   a gate electrode arranged on the gate insulating film; and
   an emitter region of the first conduction type arranged in a surface portion of the base layer, and contacting with each trench, wherein:
   a region of the semiconductor substrate functioning as an IGBT element is defined as an IGBT region;
   a region of the semiconductor substrate functioning as an FWD element is defined as an FWD region;
   the emitter region is arranged in the IGBT region;
   in the surface portion of the base layer in the FWD region, an injection limiting region of the first conduction type having an impurity concentration higher than the drift layer and a contact region of the second conduction type having an impurity concentration higher than the base layer are arranged alternately along the one direction;
   the semiconductor substrate further includes a cell region having the IGBT region and the FWD region, and an outer peripheral region surrounding the cell region and having the drift layer;
   at least a part of the cell region located at a boundary between the cell region and the outer peripheral region is defined as the FWD region;
   the base layer arranged in the cell region extends to the outer peripheral region on the drift layer; and
   the collector layer is arranged on a portion of the drift layer in the outer peripheral region opposite to the base layer.

4. The semiconductor device according to claim 3, wherein:
   the injection limiting region is arranged only in the FWD region.

5. The semiconductor device according to claim 3, wherein:

the collector layer is arranged on the drift layer opposite to the base layer in a boundary portion between the FWD region and the outer peripheral region.

6. The semiconductor device according claim 5, wherein:
the semiconductor substrate has one surface located on a side of the base layer and an other surface located on a side of the collector layer or the cathode layer opposite to the one surface; and
the collector layer arranged in the FWD region is arranged from a boundary between the FWD region and the outer peripheral region, and is equal to or longer than a length between the one surface and the other surface of the semiconductor substrate.

7. A semiconductor device comprising:
a semiconductor substrate having a drift layer of a first conduction type;
a base layer of a second conduction type arranged on the drift layer;
a collector layer of the second conduction type and a cathode layer of the first conduction type arranged on the drift layer opposite to the base layer;
a plurality of trenches penetrating the base layer and reaching the drift layer, and extending along one direction of plane directions of the semiconductor substrate;
a gate insulating film arranged on a sidewall of each trench;
a gate electrode arranged on the gate insulating film; and
an emitter region of the first conduction type arranged in a surface portion of the base layer, and contacting with each trench, wherein:
a region of the semiconductor substrate functioning as an IGBT element is defined as an IGBT region;
a region of the semiconductor substrate functioning as an FWD element is defined as an FWD region;
the emitter region is arranged in the IGBT region;
in the surface portion of the base layer in the FWD region, an injection limiting region of the first conduction type having an impurity concentration higher than the drift layer and a contact region of the second conduction type having an impurity concentration higher than the base layer are arranged alternately along the one direction; and
an interval along the one direction between adjacent injection limiting regions of a plurality of injection limiting regions arranged in a boundary portion between the FWD region and the outer peripheral region is shorter than adjacent injection limiting regions of a plurality of injection limiting regions arranged in an inner rim portion of the boundary portion.

8. A semiconductor device comprising:
a semiconductor substrate having a drift layer of a first conduction type;
a base layer of a second conduction type arranged on the drift layer;
a collector layer of the second conduction type and a cathode layer of the first conduction type arranged on the drift layer opposite to the base layer;
a plurality of trenches penetrating the base layer and reaching the drift layer, and extending along one direction of plane directions of the semiconductor substrate;
a gate insulating film arranged on a sidewall of each trench;
a gate electrode arranged on the gate insulating film; and
an emitter region of the first conduction type arranged in a surface portion of the base layer, and contacting with each trench, wherein:
a region of the semiconductor substrate functioning as an IGBT element is defined as an IGBT region;
a region of the semiconductor substrate functioning as an FWD element is defined as an FWD region;
the emitter region is arranged in the IGBT region;
in the surface portion of the base layer in the FWD region, an injection limiting region of the first conduction type having an impurity concentration higher than the drift layer and a contact region of the second conduction type having an impurity concentration higher than the base layer are arranged alternately along the one direction; and
an interval along the one direction between adjacent injection limiting regions of a plurality of injection limiting regions arranged in a boundary portion between the FWD region and the outer peripheral region is longer than adjacent injection limiting regions of a plurality of injection limiting regions arranged in an inner rim portion of the boundary portion.

* * * * *